(12) United States Patent
Ries

(10) Patent No.: US 7,238,306 B2
(45) Date of Patent: Jul. 3, 2007

(54) CONFORMAL TRIBOCHARGE-REDUCING COATING

(75) Inventor: Eric E. Ries, Maple Plain, MN (US)

(73) Assignee: Innovex, Inc., Maple Plane, MN (US)

( * ) Notice: Subject to any disclaimer, the term of this patent is extended or adjusted under 35 U.S.C. 154(b) by 351 days.

(21) Appl. No.: 10/983,268

(22) Filed: Aug. 11, 2004

(65) Prior Publication Data

US 2005/0208227 A1 Sep. 22, 2005

Related U.S. Application Data

(60) Provisional application No. 60/494,193, filed on Aug. 11, 2003.

(51) Int. Cl.
*H01B 1/00* (2006.01)
*B05D 5/12* (2006.01)
*B28B 19/00* (2006.01)

(52) U.S. Cl. .............. 252/500; 427/96.4; 427/96.1

(58) Field of Classification Search ........... 252/500; 427/96.2, 96.4
See application file for complete search history.

(56) References Cited

U.S. PATENT DOCUMENTS

| | | | | |
|---|---|---|---|---|
| 4,525,507 A * | 6/1985 | Chaker et al. | ........ | 524/104 |
| 5,422,423 A * | 6/1995 | Shacklette et al. | ........ | 528/422 |
| 5,494,609 A * | 2/1996 | Kulkarni et al. | ........ | 252/500 |
| 6,099,757 A * | 8/2000 | Kulkarni | ........ | 252/500 |
| 6,125,015 A | 9/2000 | Carlson et al. | ........ | 360/245.9 |
| 6,316,734 B1 | 11/2001 | Yang | ........ | 174/256 |
| 6,380,343 B1 | 4/2002 | Orikabe et al. | ........ | 528/75 |
| 6,482,521 B1 * | 11/2002 | Lee et al. | ........ | 428/413 |
| 6,849,800 B2 * | 2/2005 | Mazurkiewicz | ........ | 174/394 |

* cited by examiner

*Primary Examiner*—Mark Kopec
*Assistant Examiner*—Jaison Thomas
(74) *Attorney, Agent, or Firm*—Dicke, Billig & Czaja, PLLC

(57) ABSTRACT

Tribocharging-reducing conformal coating are provided for a flexible circuit, which reduce tribocharge voltage of a coated flexible circuit to less than about 15V, preferably less than about 10 V. Coating formulations include at least about 1% of a polypyrrole. Flexible circuits having a tribocharge voltage of less than about 15V, preferably less than about a 10V comprise at least one polymeric dielectric substrate, and a conductive layer formed thereon including at least one conductive element such as a trace, bond pad and/or a lead device, and a layer of a conformal coating wherein the conformal coating comprising at least about 1% of a polypyrrole compound.

8 Claims, No Drawings

CONFORMAL TRIBOCHARGE-REDUCING COATING

CROSS REFERENCE TO RELATED APPLICATIONS

This Non-Provisional Utility Patent Application claims the benefit of the filing date of U.S. Provisional Application Ser. No. 60/494,193, filed Aug. 11, 2003, entitled "CONFORMAL TRIBOCHARGE-REDUCING COATING"

FIELD OF THE INVENTION

The present invention relates to a coating for electronic substrates. More specifically, the invention relates to a conformal coating which reduces tribocharging on electronic substrates and circuits, while allowing bonding of the circuit to another electronic component through the coating.

BACKGROUND OF THE INVENTION

Flexible circuits are circuits that are formed on flexible dielectric substrates such as polymeric materials. The circuits may have one or more conductive layers as well as circuitry (also called "traces") on one or both of the major surfaces of the substrate. The circuits often include additional functional layers, e.g., insulative layers, adhesive layers, encapsulating layers, stiffening layers and the like. Flexible circuits are typically useful for electronic packages where flexibility, weight control and the like are important. In many high volume situations, flexible circuits also provide cost advantages associated with efficiency of the manufacturing processes employed.

Various types of flexible circuits are known in the industry. Generally speaking, the key differences in the various circuits stem from a number of design requirements for the devices that the circuit is connecting together, along with the requirements and limitations of the processing methods used to make the circuit. Typically, the flexible circuit is connecting a semiconductor device of some sort (integrated circuit, microprocessors, or the like) to another flex circuit, a rigid circuit board or a component of a device through connection means such as bond pads, solder balls, etc. The design factors associated with items the circuit is connecting include, but are not limited to, the number of input and output (I/O) leads from a semiconductor device that needs to be connected; the means and process for interconnection of the flexible circuits to another circuit or to a device; the required size and weight of the finished product; the environmental conditions under which the circuit will be assembled and used; and the data transmission rates to which the circuit will be subjected.

Flexible circuits have become widely used in telecommunications equipment and consumer and industrial electronic appliances. As the packaging of those appliances becomes simpler, more compact, more reliable, and more highly functional, requirements imposed on flexible printed circuit boards become extremely stringent. The boards are required to have high thermal resistance, good weatherability, electric insulation properties, bonding strength, and flexibility, and to meet severe conditions, including limits on tribocharging of the electronic packages.

Polymeric films, such as those used in flexible circuits, are typically electrically insulating and exhibit a propensity towards the generation of electrical charges (referred to hereinafter as tribocharging). Tribocharging is undesirable for a number of reasons. Contaminants such as dust particles are attracted by charged surfaces. Tribocharges are also known to damage various types of electronic devices, such as semiconductor devices, due to electrical currents associated with the discharge of accumulated tribocharge. Therefore, what is needed is a flexible circuit construction that reduces tribocharging on the surface of the circuit such that the potential for damage to electrical components connected to the circuit is reduced.

Protective films coated or placed onto the surface are one known construction. Known surface protective films of flexible wiring circuits are used to protect against cracking and contamination as well as tribocharging, and include, for example, those prepared by cutting polyimide films using a die made corresponding to the pattern, which are then adhered onto a substrate with an adhesive; and those prepared by applying a radiation-curable or thermosetting overcoat composition. Resin compositions used as protective films include epoxy resins, acrylic resins, and the like. However, such resins only provide minimal protection against tribocharging. Further, most such resins must be punched or drilled in order to provide access through the protective film to the circuitry.

It would be desirable to reduce the tribocharging of the electrical components to a range of about 15 Volts (V), preferably less than 10V.

It has now been discovered that a coating comprising a polypyrrole not only reduces tribocharging significantly but that bonding of electronic components to traces on the flexible circuit can be made through the coating, simplifying production and connection of the flexible circuit to such electronic components.

SUMMARY OF THE INVENTION

One aspect of the present invention relates to a tribocharging-reducing conformal coating for a flexible circuit comprising at least one inherently conductive polymer, wherein the coating reduces the tribocharge voltage of a coated flexible circuit to less than about 15V, preferably less than about 10 V.

In one embodiment, a tribocharging-reducing conformal coating provided by the invention comprises at least about 1% of a polypyrrole having the formula below where n is more than 1:

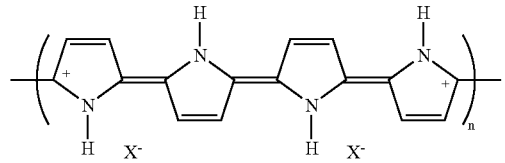

Another aspect of the invention provides a flexible circuit comprising at least one polymeric dielectric substrate, and a conductive layer formed thereon, said conductive layer comprising at least one conductive element such as a trace, bond pad and/or a lead device, and a conformal coating on at least one major surface of said flexible circuit, wherein the conformal coating comprising at least about 1% of a polypyrrole compound, said flexible circuit having a tribocharge voltage of less than about 15V, preferably less than about a 10V.

In another aspect, the invention provides an electronic package comprising a flexible circuit and at least one additional electronic component, said flexible circuit comprising at least one polymeric dielectric substrate, and a conductive layer formed thereon, said conductive layer comprising at least one conductive element such as a trace, bond pad and/or a lead device, wherein the conformal coating comprising at least about 1% of a polypyrrole compound, said flexible circuit having a tribocharge voltage of less than about 15V, preferably less than about a 10V.

In yet another aspect, the coating of the invention can be used to treat other types of electronic components to reduce tribocharging on such component surfaces to less than about 15V, preferably less than about 10V.

As used herein, the following terms have these meanings:

1. The term "tribocharging" means a charge caused by contact between two materials with neutrally charged surfaces (<4 Å) followed by separation. The materials will have undergone tribocharging and now be at a non-neutral surface charge level.

3. The term "conformal layer" refers to a static charge dissipative layer that conforms to the conductive elements formed in the dielectric substrate.

4. The term "electronic component" refers to interconnect devices, semi-conductor devices, electronic packages and the like.

5. The term "conductive element" refers to features such as solder ball pads, traces, bonding pads, and the like.

6. The term "polypyrrole" is a polymer formed from repeating pyrrole units, with the formula shown, supra, and is to an inherently conductive conjugated polymer exhibiting interchain movement of electrons.

As used herein, all weights, ratios and amounts are by weight unless otherwise specified.

DETAILED DESCRIPTION OF THE INVENTION

Formulations useful to make conformal coatings of the invention contain at least one inherently conductive polymer. Useful conductive polymers include conjugated polymers such as polyacetylene, polyanilines, polypyrroles, polythiophenes, poly(p-phenylenevinylene), and the like. Conjugated polymers are organic semiconductors, distinguished by alternating single and double bonds between carbon atoms or between a carbon and a nitrogen atom on the polymer backbone. One of the most stable conjugated polymers in aqueous media is polypyrrole, which can also be patterned using standard photolithography.

In a preferred embodiment, the coating contains at least about 1% of a polypyrrole polymer. Polypyrroles have the following general formula:

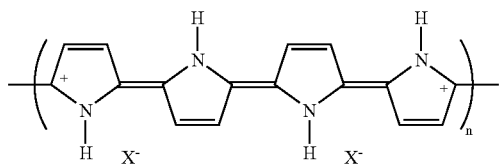

The behavior of conjugated polymers is altered with chemical doping. Generally, polymers such as polypyrrole are partially oxidized to produce p-doped materials for use in electronic applications.

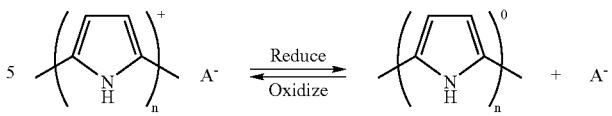

In one embodiment, the coating formulation of the invention uses a polypyrrole doped with organic acids. Pyrrole materials are generally doped at a range of from about 20% to about 40%. Other useful dopants include arsenic compounds such as arsenic pentafluoride, $AsF_5$, and arsenic diiodide, $AsI_2$.

Coating formulations of the invention contain at least about 1% conjugated acid, preferably from about 1% to about 5%.

Coating formulations of the invention may comprise additional materials in order to improve the rheology of the formulation solution and increase the mechanical stability of the final cured coating such as a pyrrolidone compound. Useful compounds include 1-methyl-2-pyrrolidone, N-methyl pyrrolidone and the like, which are widely commercially available. Electronic grade materials are preferred. When used, such compounds typically comprise from about 2% to about 8% of the formulation, preferably from about 3% to about 6%.

The formulation for coatings of the invention may also comprise an acrylic crosslinker in order to assist with "curing" the formulation into the solid conformal coating. Useful acrylic crosslinkers include Rhoplex® HA-16, Rhoplex® HA-12, and the like, which are self-crosslinking acrylic emulsions which provide a flexible but firm-to-the-touch coating when cured. Such acrylic emulsions have glass transition (Tg) values above about 10° C., preferably above about 20° C.

In one embodiment, the formulation also contains a fluorochemical additive, preferably a perfluorinated organic compound. Use of such an additive can yield improved surface characteristics for the coating, anti stick properties, and reduce the coefficient of friction of the coating, even when added in small amounts. Coatings formulations of the invention may comprise from about 0.01 to about 0.5% by weight of a perfluorinated compound. Such compounds are available under the trade name Fluorolink® from Solvay Solexis, Inc.

The formulation may also contain additional adjuvants such as antioxidants, dyes, curing accelerators, thixotropic agents and the like in such amounts as will not interfere with the ability of the conjugated polymer to reduce the tribocharging across the coated surface, or reduce the coating formulation's ability to conform to the substrate.

Flexible circuits according to the present invention are those including a dielectric substrate, at least one conductive layer on the dielectric substrate patterned to define a plurality of conductive elements. The dielectric substrate is preferable a flexible polymeric film material that is substantially cured. Useful organic polymers include polyimides including modified polyimides such as polyester imides and poly-imide-esters, polysiloxane imides and polyamide, polymethylmethacrylate, polyesters such as poly(ethylene terephthalate), polycarbonates, polytetrafluoroethylenes, and mixtures thereof. Preferred polymers include various polyimides available from E.I DuPont de Nemours and Company under the tradenames Kapton® and Pyralin®.

The conductive layer, typically copper, may be laminated to the polymer layer by means of adhesive bonding, or a conductive foil may be coated with a liquid polymer. Typical substrates include polymeric layers having thicknesses of between about 25 micrometers and about 125 micrometers, while the conductive layer is from about 1 to about 50 micrometers in thickness. Photoresists are then laminated onto one or both sides of the substrate and exposed through a mask, created a crosslinked portion thereof. The unexposed portions of the photoresist are then developed with an appropriate solvent, and The conductive side of the laminate is then plated up to desired circuit thickness. The laminate is then subject to further steps such as etching, sputtering, and the like where additional conductive features such as bond pads, traces, vias, leads, and the like are formed. Further layers may be added and processed. The flexible circuit is then ready to have the conformal coating applied to one or both major surfaces.

The coating formulation is mixed into a solution which may be applied by means of a variety of conventional methods including dipping, or spray coating, or where only a portion of the flexible circuit or electronic component is to be coated, screen printing maybe used.

Coating formulations are cured after being applied to the substrate. Curing may be accomplished according to the conventional methods, such as baking or radiation curing. Where heat curing is used, a pre-bake step may also be advantageous. In a prebake step, the coated component is heated to about 100° C. for a period of 15 minutes to one hour. The component or circuit is then baked at temperatures of 150° C. or more for a period of at least about 10 minutes.

Final electronic packages or appliances are made by connecting additional electronic components such as semiconductor devices, interconnect devices.

EXAMPLE

A solution for conformal coatings was made by mixing 2.1% polypyrrole, 9.5% Rhoplex® HA16, 5.0% n-methyl pyrrolidone, and 012% Fluorolink® S10. Electronic components dipped in this solution and then cured had a tribocharge voltage of less than 5V.

What is claimed is:

1. A flexible circuit comprising at least one polymeric dielectric substrate, and a conductive layer formed thereon, said conductive layer comprising at least one conductive element, and a conformal coating on at least one major surface of said flexible circuit, wherein the conformal coating comprises a) at least about 1% of conjugated polypyrrole polymer, b) pyrrolidones, and c) perfluorinated organic compounds, said flexible circuit having a tribocharge voltage of less than about 15V, preferably less than about 10V when measured across said at least one major surface of said flexible circuit.

2. A flexible circuit according to claim 1 wherein said conjugated polymer is a polypyrrole having the formula

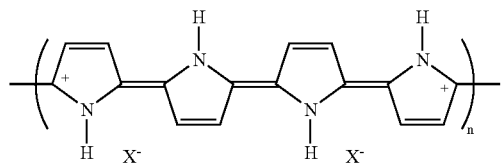

wherein n is an integer greater than 1, and X is any anion.

3. A flexible circuit according to claim 2 wherein said conformal coating comprises from about 1% to about 5% of said polypyrrole.

4. A flexible circuit according to claim 1 wherein said conformal coating comprises from about 2% to about 8% of a pyrrolidone compound.

5. A flexible circuit according to claim 4 wherein said pyrrolidone is present in an amount of from about 3% to about 6%.

6. A flexible circuit according to claim 1 wherein said conformal coating comprises a perfluorinated organic compound.

7. A flexible circuit according to claim 6 wherein said perfluorinated organic compound is present in an amount of from about 0.01% to about 0.5%.

8. An electronic package comprising a flexible circuit according to claim 1 having at least one additional component electrically connected thereto.

* * * * *